(12) United States Patent
Zhou et al.

(10) Patent No.: US 10,943,842 B2
(45) Date of Patent: Mar. 9, 2021

(54) SEMICONDUCTOR DEVICE WITH A PROTECTION MECHANISM AND ASSOCIATED SYSTEMS, DEVICES, AND METHODS

(71) Applicant: Micron Technology, Inc., Boise, ID (US)

(72) Inventors: Wei Zhou, Boise, ID (US); Bret K. Street, Meridian, ID (US); Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/775,163

(22) Filed: Jan. 28, 2020

(65) Prior Publication Data

US 2020/0168517 A1 May 28, 2020

Related U.S. Application Data

(62) Division of application No. 15/693,230, filed on Aug. 31, 2017, now Pat. No. 10,580,710.

(51) Int. Cl.
*H01L 23/00* (2006.01)
*H01L 23/10* (2006.01)
(Continued)

(52) U.S. Cl.
CPC .............. *H01L 23/10* (2013.01); *H01L 23/04* (2013.01); *H01L 24/17* (2013.01); *H01L 24/67* (2013.01);
(Continued)

(58) Field of Classification Search
CPC .......... H01L 23/00; H01L 23/10; H01L 23/04; H01L 23/16; H01L 24/17; H01L 24/18;
(Continued)

(56) References Cited

U.S. PATENT DOCUMENTS

| 8,299,633 B2 | 10/2012 | Su |
| 9,093,364 B2 | 7/2015 | Pagaila |

(Continued)

FOREIGN PATENT DOCUMENTS

| CN | 102668075 A | 9/2012 |
| KR | 20110125796 A | 11/2011 |
| TW | 201727772 A | 8/2017 |

OTHER PUBLICATIONS

International Application No. PCT/US2018/041746—International Search Report and Written Opinion, dated Nov. 2, 2018, 12 pages.

(Continued)

*Primary Examiner* — Chuong A Luu
(74) *Attorney, Agent, or Firm* — Perkins Coie LLP

(57) ABSTRACT

A semiconductor device includes a substrate including a substrate top surface; interconnects connected to the substrate and extending above the substrate top surface; a die attached over the substrate, wherein the die includes a die bottom surface that connects to the interconnects for electrically coupling the die and the substrate; and a metal enclosure directly contacting and vertically extending between the substrate top surface and the die bottom surface, wherein the metal enclosure peripherally surrounds the interconnects.

15 Claims, 8 Drawing Sheets

(51) Int. Cl.
  *H01L 25/065* (2006.01)
  *H01L 23/04* (2006.01)
  *H01L 25/00* (2006.01)
(52) U.S. Cl.
  CPC .............. *H01L 24/70* (2013.01); *H01L 24/73* (2013.01); *H01L 24/81* (2013.01); *H01L 24/89* (2013.01); *H01L 25/0657* (2013.01); *H01L 25/50* (2013.01); *H01L 24/16* (2013.01); *H01L 2224/0401* (2013.01); *H01L 2224/05647* (2013.01); *H01L 2224/131* (2013.01); *H01L 2224/13025* (2013.01); *H01L 2224/16145* (2013.01); *H01L 2224/16146* (2013.01); *H01L 2224/16227* (2013.01); *H01L 2224/17181* (2013.01); *H01L 2224/17517* (2013.01); *H01L 2224/8109* (2013.01); *H01L 2224/81075* (2013.01); *H01L 2224/8182* (2013.01); *H01L 2224/81122* (2013.01); *H01L 2224/81815* (2013.01); *H01L 2225/06513* (2013.01); *H01L 2225/06517* (2013.01); *H01L 2225/06527* (2013.01); *H01L 2225/06541* (2013.01); *H01L 2225/06575* (2013.01); *H01L 2225/06593* (2013.01); *H01L 2924/01029* (2013.01); *H01L 2924/3025* (2013.01)
(58) Field of Classification Search
  CPC ......... H01L 24/20; H01L 24/24; H01L 24/25; H01L 24/30; H01L 24/33; H01L 24/67; H01L 24/70; H01L 24/73; H01L 24/81; H01L 24/89; H01L 25/00; H01L 25/50; H01L 25/065; H01L 25/0657; H01L 2224/0401; H01L 2224/05647; H01L 2224/131; H01L 2224/8109; H01L 2224/13025; H01L 2224/16145; H01L 2224/16146; H01L 2224/16227; H01L 2224/17181; H01L 2224/17517; H01L 2224/81075; H01L 2224/81122; H01L 2224/81815; H01L 2224/8182; H01L 2225/06513; H01L 2225/06517; H01L 2225/06527; H01L 2225/06575; H01L 2225/06541; H01L 2225/06593; 2924/010129; H01L 2924/3025
  USPC ........................................................ 438/613
  See application file for complete search history.

(56) References Cited

U.S. PATENT DOCUMENTS

| | | |
|---|---|---|
| 9,356,009 B2 | 5/2016 | Chandolu |
| 10,381,329 B1 | 8/2019 | Zhou et al. |
| 2003/0104652 A1 | 6/2003 | Lebonheur et al. |
| 2003/0214029 A1 | 11/2003 | Tao et al. |
| 2004/0014308 A1 | 1/2004 | Kellar et al. |
| 2004/0043515 A1 | 3/2004 | Goller et al. |
| 2004/0159960 A1 | 8/2004 | Fujiwara et al. |
| 2004/0231872 A1 | 11/2004 | Arnold et al. |
| 2005/0135041 A1 | 6/2005 | Kang et al. |
| 2006/0103015 A1 | 5/2006 | Farrar et al. |
| 2007/0057357 A1 | 3/2007 | Chen |
| 2007/0267725 A1 | 11/2007 | Lee et al. |
| 2008/0054433 A1 | 3/2008 | Yoo et al. |
| 2009/0014856 A1 | 1/2009 | Knickerbocker |
| 2009/0121334 A1 | 5/2009 | Oi et al. |
| 2009/0194861 A1 | 8/2009 | Bonse et al. |
| 2009/0224371 A1 | 9/2009 | Yu et al. |
| 2010/0105171 A1 | 4/2010 | Lee et al. |
| 2010/0155966 A1* | 6/2010 | Moden .............. H01L 23/49811 257/783 |
| 2010/0244208 A1 | 9/2010 | Pagaila et al. |
| 2010/0258950 A1 | 10/2010 | Li et al. |
| 2011/0147899 A1 | 6/2011 | Dahilig et al. |
| 2013/0075879 A1 | 3/2013 | Yang |
| 2013/0075923 A1 | 3/2013 | Park et al. |
| 2013/0234317 A1 | 9/2013 | Chen et al. |
| 2014/0197526 A1 | 7/2014 | Yoo et al. |
| 2015/0014844 A1 | 1/2015 | Wu et al. |
| 2015/0091178 A1 | 4/2015 | Reber et al. |
| 2015/0123271 A1* | 5/2015 | Sylvestre .............. H01L 21/563 257/737 |
| 2015/0187745 A1 | 7/2015 | Zhang et al. |
| 2015/0333026 A1 | 11/2015 | Gandhi et al. |
| 2015/0348954 A1 | 12/2015 | Chandolu |
| 2015/0371969 A1* | 12/2015 | Yu ....................... H01L 25/0657 257/777 |
| 2017/0040309 A1 | 2/2017 | Kent |
| 2017/0125375 A1 | 5/2017 | Chinnusamy et al. |
| 2018/0151513 A1 | 5/2018 | Stone |
| 2019/0067137 A1 | 2/2019 | Zhou et al. |
| 2019/0229089 A1 | 7/2019 | Zhou et al. |
| 2019/0229090 A1 | 7/2019 | Zhou et al. |
| 2019/0267352 A1 | 8/2019 | Zhou et al. |

OTHER PUBLICATIONS

International Application No. PCT/US2018/063662—International Search Report and Written Opinion, dated Apr. 5, 2019, 14 pages.
TW Patent Application No. 107125987—Taiwanese Office Action and Search Report, dated Apr. 10, 2019, with English Translation, 11 pages.
TW Patent Application No. 107145862—Taiwanese Office Action and Search Report, dated Sep. 20, 2019, with English Translation, 12 pages.

* cited by examiner

SEMICONDUCTOR DEVICE WITH A PROTECTION MECHANISM AND ASSOCIATED SYSTEMS, DEVICES, AND METHODS

CROSS-REFERENCE TO RELATED APPLICATION(S)

This application is a division of U.S. patent application Ser. No. 15/693,230, filed Aug. 31, 2017; which is incorporated herein by reference in its entirety.

TECHNICAL FIELD

The present technology is related to semiconductor devices, and, in particular, to semiconductor devices with a protection mechanism.

BACKGROUND

Semiconductor devices dies, including memory chips, microprocessor chips, and imager chips, typically include a semiconductor die mounted on another structure (e.g., a substrate, another die, etc.) and encased in a plastic protective covering. The die includes functional features, such as for memory cells, processor circuits, and imager devices, as well as interconnects that are electrically connected to the functional features. The interconnects can be electrically connected to terminals outside the protective covering to connect the die to higher level circuitry.

As illustrated in FIG. 1, a semiconductor device 100 (e.g., a three dimensional interconnect (3DI) type of device or a semiconductor package device) can include a die 102 having die interconnects 104 thereon connected to a substrate structure 106 (e.g., a printed circuit board (PCB), a semiconductor or wafer-level substrate, another die, etc.) having substrate interconnects 108 thereon. The die 102 and the substrate structure 106 can be electrically coupled to each other through the die interconnects 104 and the substrate interconnects 108. Further, the die interconnects 104 and the substrate interconnects 108 can be directly contacted each other (e.g., through a bonding process, such as diffusion bonding or hybrid bonding) or through an intermediate structure (e.g., solder). The semiconductor device 100 can further include an encapsulant, such as an underfill 110, surrounding or encapsulating the die 102, the die interconnects 104, the substrate structure 106, the substrate interconnects 108, a portion thereof, or a combination thereof.

With technological advancements in other areas and increasing applications, the market is continuously looking for faster and smaller devices. To meet the market demand, physical sizes or dimensions of the semiconductor devices are being pushed to the limit. For example, efforts are being made to reduce a separation distance between the die 102 and the substrate structure 106 (e.g., for 3DI devices and die-stacked packages).

However, due to various factors (e.g., viscosity level of the underfill 110, trapped air/gases, uneven flow of the underfill 110, space between the interconnets, etc.), the encapsulation process can be unreliable, such as leaving voids 114 between the die 102 and the substrate structure 106 (e.g., with portions of the interconnects failing to directly contact the underfill 110). The voids 114 can cause shorting and leakage between the interconnects (e.g., between the substrate interconnect 108 and/or between the die interconnects 104), causing an electrical failure for the semiconductor device 100. Further, as the device grows smaller, the manufacturing cost can grow (e.g., based on using nano-particle underfill instead of traditional underfill).

DETAILED DESCRIPTION

Figure 1:
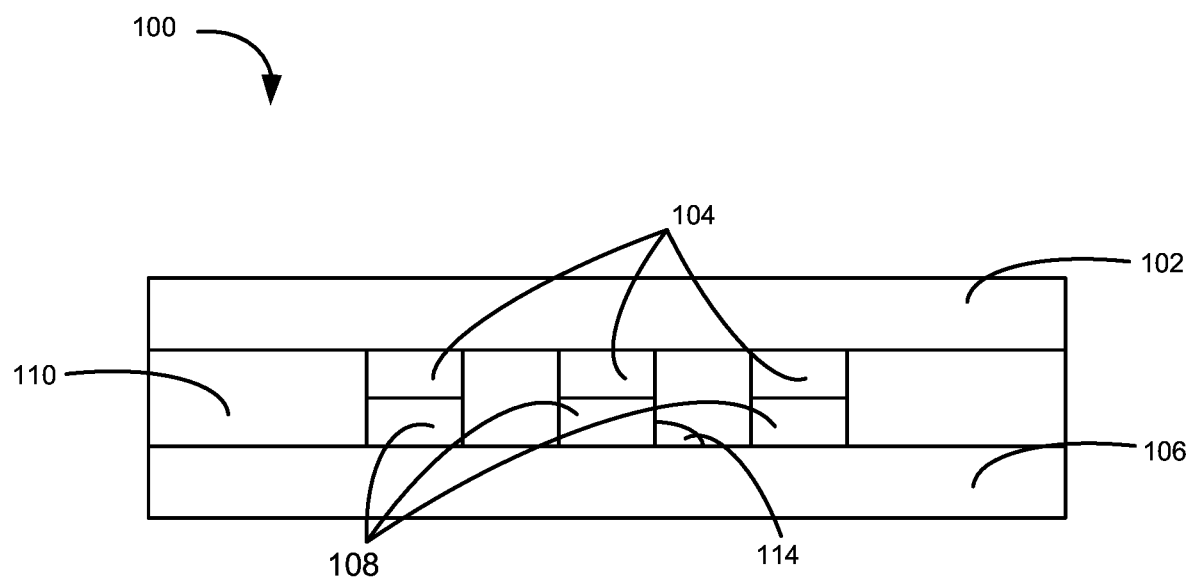
FIG. 1 is a cross-sectional view of a semiconductor device in accordance with existing technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or to a singulated die-level substrate, or another die for die-stacking or 3DI applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of protecting the semiconductor dies and the associated electrical connections. For example, semiconductor devices (e.g., 3DI packaging solutions) can each include a semiconductor die with die interconnects thereon connected to a substrate structure. To protect the die and the die interconnects (e.g., against environmental factors, such as moisture, debris, etc.), the semiconductor devices can each include a metal (e.g., copper, aluminum, alloy, etc.) enclosure that surrounds the die interconnects along a horizontal plane. The metal enclosure can further extend vertically between and/or directly contacting the die and the substrate to enclose the die interconnects. As such, the semiconductor devices can use the metal enclosure instead of any encapsulants (e.g., underfills) to isolate the die interconnects from surrounding exterior space and/or environment.

In some embodiments, the metal enclosure can be formed based on copper-on-copper (Cu—Cu) bonding (e.g., such as based on diffusion bonding techniques). In some embodiments, the metal enclosure can include solder.

In some embodiments, each semiconductor device can include multiple enclosures. For example, the semiconductor device can include a set of concentric enclosures. Also for example, the semiconductor device can include a set of enclosures that each have a different shape and/or dimension. Some of the enclosures can be used to carry signals or electrical planes (e.g., for power connection, ground planes, etc.).

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
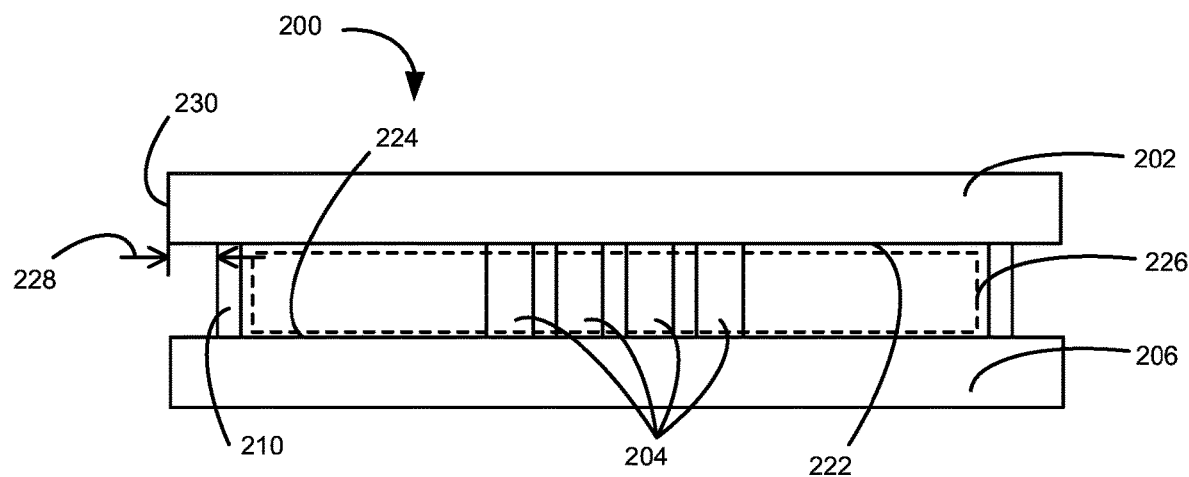
FIG. 2 is a cross-sectional view along a line 2-2 in FIG. 3 of a semiconductor device in accordance with an embodiment of the present technology.
Figure 3:
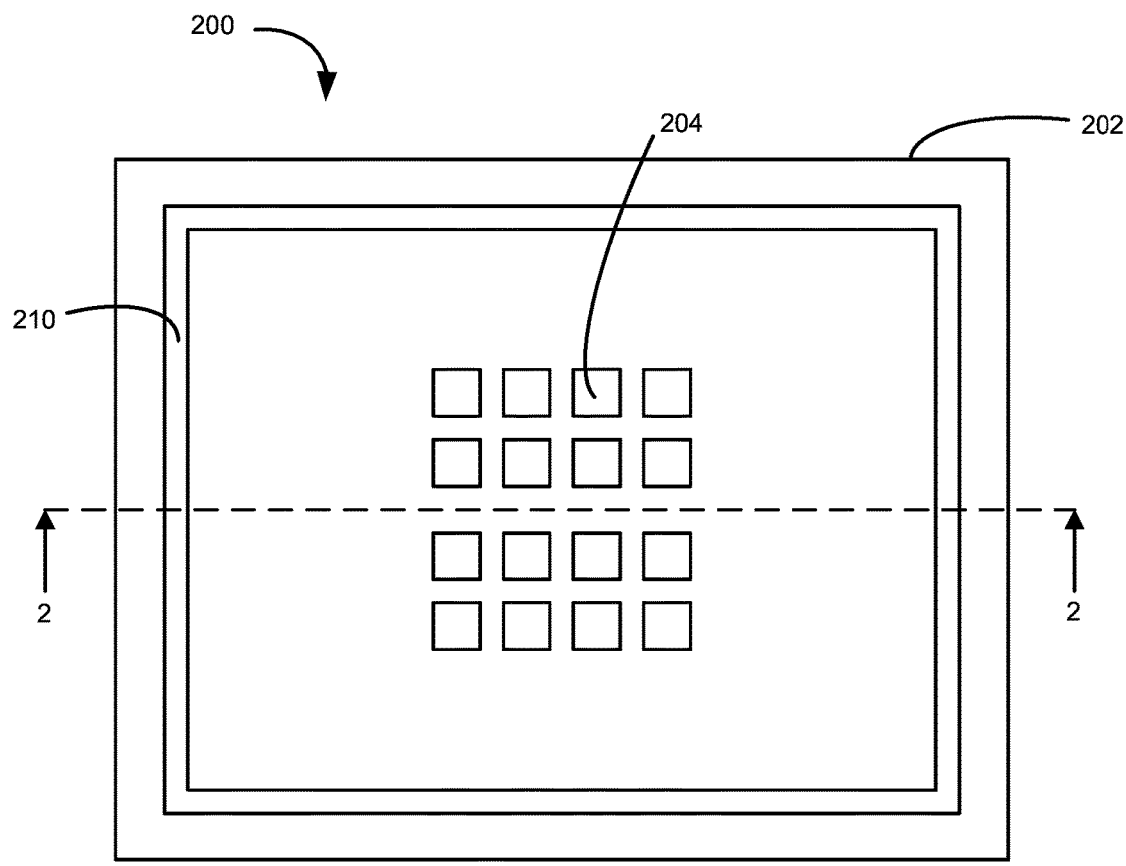
FIG. 3 is a plan view of the semiconductor device of FIG. 2 in accordance with an embodiment of the present technology.

FIG. 2 is a cross-sectional view along a line 2-2 in FIG. 3 of a semiconductor device 200 (e.g., a semiconductor die assembly, including a 3DI device or a die-stacked package) in accordance with an embodiment of the present technology. The semiconductor device 200 can include a semiconductor die 202 ("die 202") mounted on or connected to a substrate 206 (e.g., another die). The die 202 can be electrically connected to the substrate 206 through metal or conductive interconnects 204 ("interconnects 204"). In some embodiments, the interconnects 204 can be structures resulting from bonding or joining (e.g., such as through diffusion bonding or hybrid bonding) pillars, pads, or interconnect structures protruding from the die 202 to the corresponding structures protruding from the substrate 206.

The semiconductor device 200 can include a metal (e.g., copper, aluminum, alloy, etc.) enclosure structure 210 ("enclosure 210") that continuously surrounds or encloses the interconnects 204 along a horizontal plane. The enclosure 210 (e.g., a continuous and solid metallic structure that forms a wall peripherally surrounding the interconnects 204) can further extend from and directly contact a die bottom surface 222 and a substrate top surface 224 to enclose an internal space 226 ("enclosed space 226"). The enclosed space 226 can be vacuum or filled with inert or specific gas except for the interconnects 204 (e.g., without any encapsulant material or underfill therein). Accordingly, the enclosure 210 can isolate the interconnects 204 from external space on the outside of the enclosure 210.

In some embodiments, the enclosure 210 can be located at an edge offset distance 228 (e.g., a distance measured along a horizontal direction) from a die periphery edge 230. In some embodiments, the enclosure 210 can be located such that an edge or a surface thereof is coplanar or coincident with the die periphery edge 230 along a vertical plane or line (e.g., where the edge offset distance 228 is 0).

FIG. 3 is a plan view of the semiconductor device 200 of FIG. 2 in accordance with an embodiment of the present technology. FIG. 3 can correspond to a bottom view of the semiconductor device 200 without the substrate 206 of FIG. 2. As discussed above, the enclosure 210 can encircle a periphery or a perimeter of the interconnects 204 along a plane.

For illustrative purposes, the enclosure 210 is shown having a rectangular shape, uniform thickness or width, and concentric with a shape or outline of the die 202. However, it is understood that the enclosure 210 can be different. For example, the enclosure 210 can have an oval shape, an irregular or asymmetrical shape, or any N-sided polygonal shape. Also for example, the enclosure 210 can have varying thickness or width at different portions. Also for example, the enclosure 210 can be offset or non-concentric with respect to the interconnects 204 or an arrangement thereof, the shape or outline of the die 202, or a combination thereof.

The enclosure 210 provides decrease in overall size of the semiconductor device. Because underfill is not necessary, the bond line thickness can be reduced, leading to a very low packaging height for multiple-die stacking. Further, the enclosure 210 that excludes solder (e.g., solid copper structure, such as resulting from Cu—Cu diffusion bonding) provides decrease in manufacturing cost by eliminating pillar bumping. Also, the enclosure 210 that excludes solder provides reduction in failure rates by providing clean joints without solder caps, which removes failure modes associated with solder bridging, slumping, starvation, intermetallic compound (IMC), electromagnetic (EM) effect, etc.

The enclosure 210 also provides decrease in manufacturing cost and failure rates as the package height is decreased. The enclosure 210 can protect and isolate the interconnects 204 from environmental factors (e.g., moisture, debris, etc.), which eliminates the need for underfills (e.g., nano-particle underfills). Accordingly, the costs and the error rates associated with underfill laminate or flowing process, both of which increases rapidly as the space between the die bottom surface 222 and the substrate top surface 224 decreases, can be eliminated based on using the enclosure 210 to replace the underfill. Further, the enclosure 210 provides a joint that satisfies mechanical, thermal, and electrical traits or benefits previously provided by the underfill.

Figure 4:
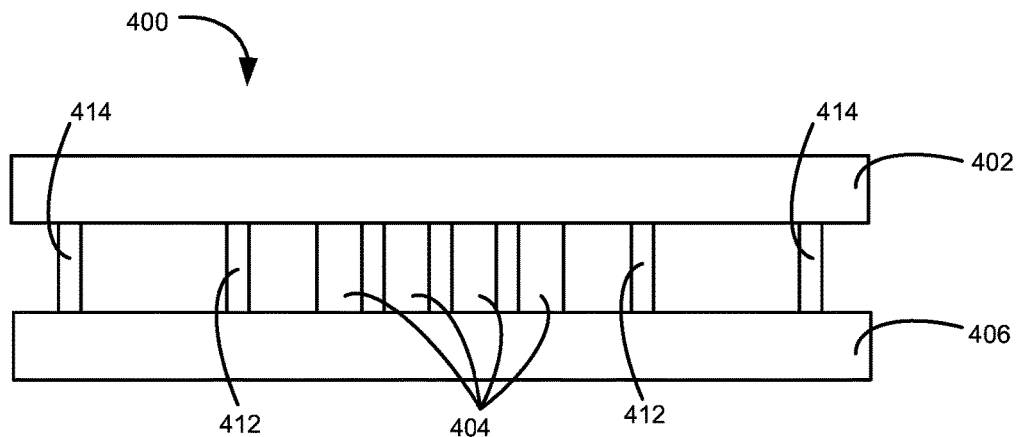
FIG. 4 is a cross-sectional view along a line 4-4 in FIG. 5 of a semiconductor device in accordance with an embodiment of the present technology.
Figure 5:
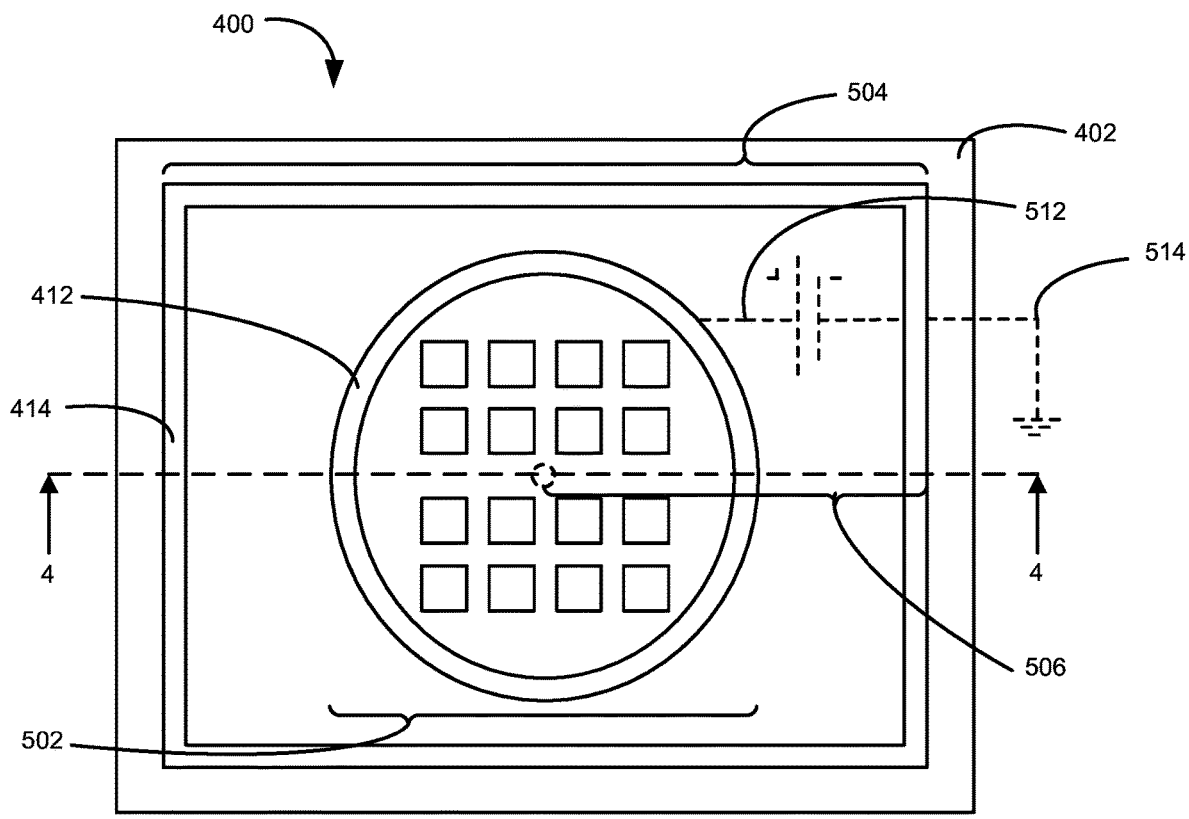
FIG. 5 is a plan view of the semiconductor device of FIG. 4 in accordance with an embodiment of the present technology.

FIG. 4 is a cross-sectional view along a line 4-4 in FIG. 5 of a semiconductor device 400 (e.g., a semiconductor die assembly, including a 3DI device or a die-stacked package) in accordance with an embodiment of the present technology. Similar to the semiconductor device 200 of FIG. 2, the semiconductor device 400 can include a semiconductor die 402 ("die 402") mounted on or connected to a substrate 406 (e.g., another die) and metal or conductive interconnects 404 ("interconnects 404") that extend vertically to directly contact and electrically couple the die 402 and the substrate 406.

The semiconductor device 400 can include multiple instances of the metal enclosure (e.g., the enclosure 210 of FIG. 2). For example, the semiconductor device 400 can include a first enclosure 412 and a second enclosure 414 that include metal (e.g., copper, aluminum, alloy, etc.). Both the first enclosure 412 and the second enclosure 414 can be continuous and solid metallic structures that form a wall. At least one or all of the metal enclosures (e.g., the first enclosure 412, the second enclosure 414, or other additional metal enclosures) can peripherally surround the interconnects 404 and isolate the interconnects 204 from external space on the outside of the enclosure 412 or 414.

In some embodiments, the first enclosure 412 can be an inner enclosure and the second enclosure 414 can be an outer enclosure. For example, the first enclosure 412 can be located closer to the interconnects 404 than the second enclosure 414, with the first enclosure 412 located between the interconnects 404 and the second enclosure 414. The first enclosure 412 can peripherally surround or encircle the interconnects 404 along a horizontal plane. Also along the horizontal plane, the second enclosure 414 can peripherally surround or encircle the first enclosure 412 and thereby the interconnects 404.

Similar to the semiconductor device 200, the semiconductor device 400 can isolate inner spaces (e.g., the second space encircled by the second enclosure 414 and the first space encircled by the first enclosure 412, where the first space exterior and the second space can overlap) from space exterior to enclosures. One or more of the enclosed spaces can be void except for the interconnects 404 (e.g., without any encapculant material or underfill therein). Accordingly, the enclosure 412 or 414 can isolate the interconnects 404 from the external space and the corresponding environmental factors without the use of underfill or other encapsulants.

For illustrative purposes, the outer-most enclosure (e.g., the second enclosure 414 as illustrated in FIG. 4) of the semiconductor device 400 is shown as being located inward (e.g., thereby creating an overhang with a periphery portion of the die 402 according to the edge offset distance 228 of FIG. 2) from a periphery edge or surface of the die 402 (e.g., the die periphery edge 230). However, it is understood that the outer-most enclosure can be located with an outer or distal surface (e.g., with respect to a center portion of the die 402 and/or the interconnects 404) coincident with the periphery edge or surface of the die 402 (e.g., thereby creating a flush or continuous outer perimeter surface across the die periphery surface, the outer surface of the outer-most enclosure, and a substrate periphery surface).

FIG. 5 is a plan view of the semiconductor device 400 of FIG. 4 in accordance with an embodiment of the present technology. FIG. 5 can correspond to a bottom view of the semiconductor device 400 without the substrate 406 of FIG. 4. As discussed above, the first enclosure 412, the second enclosure 414, or a combination thereof can encircle a periphery or a perimeter of the interconnects 404 along a plane. The second enclosure 414 can further encircle a periphery or a perimeter of the first enclosure 412 along the plane.

The first enclosure 412 can have a first shape 502 (e.g., a shape of a cross-sectional outline), and the second enclosure 414 can have a second shape 504 that is similar to or different from the first shape 502. For illustrative purposes, the first shape 502 is shown using a circle or an oval and the second shape 504 is shown using a rectangle. However, it is understood that the first shape 502 and the second shape 504 can be different (e.g., such as for an irregular or asymmetrical shape or any N-sided polygonal shape).

Also for illustrative purposes, the first enclosure 412 and the second enclosure 414 are shown having a concentric arrangement 506 relative to each other and the die 402. However, it is understood that the first enclosure 412 and the second enclosure 414 can be offset from each other and/or offset from the die 402 for non-concentric arrangements. In some embodiments, the multiple enclosures can electrically float (e.g., without any electrical connections to circuits in the die 402) or connect to signals or electrical levels (e.g., power or ground). For example, the first enclosure 412 can have a first electrical connection 512 (e.g., active signal, power, ground, etc.) and the second enclosure 414 can have a second electrical connection 514 (e.g., active signal, power, ground, etc.). The first electrical connection 512 and the second electrical connection 514 can be connected to the same or different level or signal. In some embodiments, one of the inner electrical connections (e.g., the first electrical connection 512 as illustrated in FIG. 5) can be to a power/voltage source and the outer-most electrical connection (e.g., the second electrical connection 514 as illustrated in FIG. 5) can be to electrical ground. In some embodiments, the inner-most electrical connection can be to ground and/or the outer-most electrical connection can be to a power/voltage source.

Also for illustrative purposes, the first enclosure 412 and the second enclosure 414 are shown as being nested (e.g., with the second enclosure 414 encircling the first enclosure 412). However, it is understood that the first enclosure 412 and the second enclosure 414 can be non-nested (e.g., arranged as non-concentric shapes, as overlapping or non-overlapping shapes, or a combination thereof).

Electrically connecting the metal enclosure(s) to communicate voltages (e.g., common source voltage or ground) and/or signals provides increased efficiency for the semiconductor device. For example, the voltage level and/or the ground can be removed from the interconnects, thereby allowing the interconnects to communicate more signals. Also for example, based on a distance or an arrangement between the interconnects and the enclosure(s), certain signals (e.g., noise sources) can be separated from the interconnects beyond the spacing allowed between the interconnects. Further, electrically connecting the metal enclosure(s) to electrical connections (e.g., ground) can further reduce errors associated with noise or electromagnetic interference (EMI).

Figure 6:
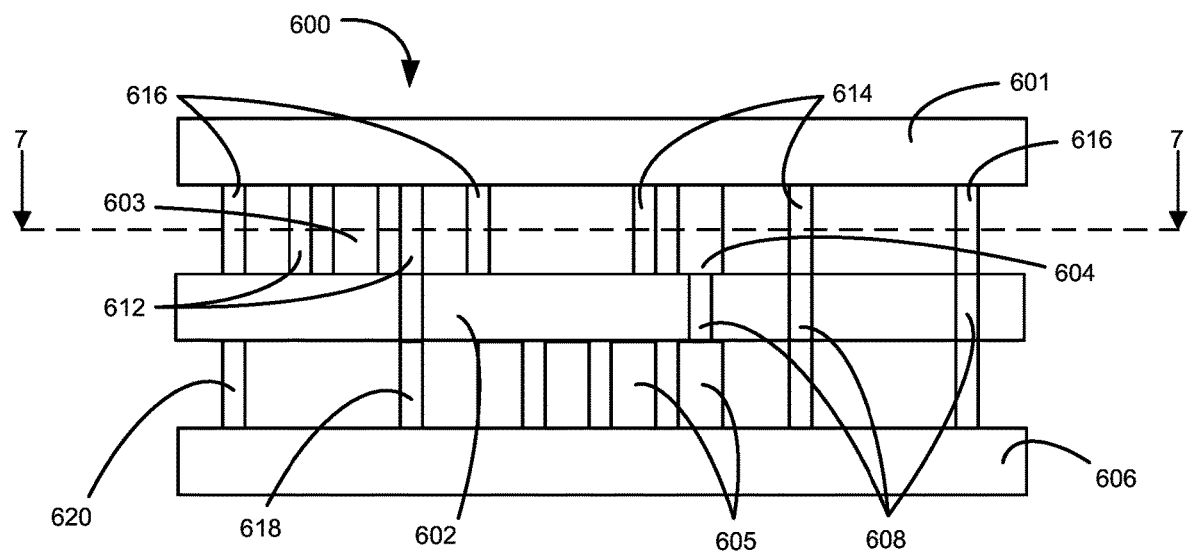
FIG. 6 is a cross-sectional view along a line 6-6 in FIG. 7 of a semiconductor device in accordance with an embodiment of the present technology.
Figure 7:
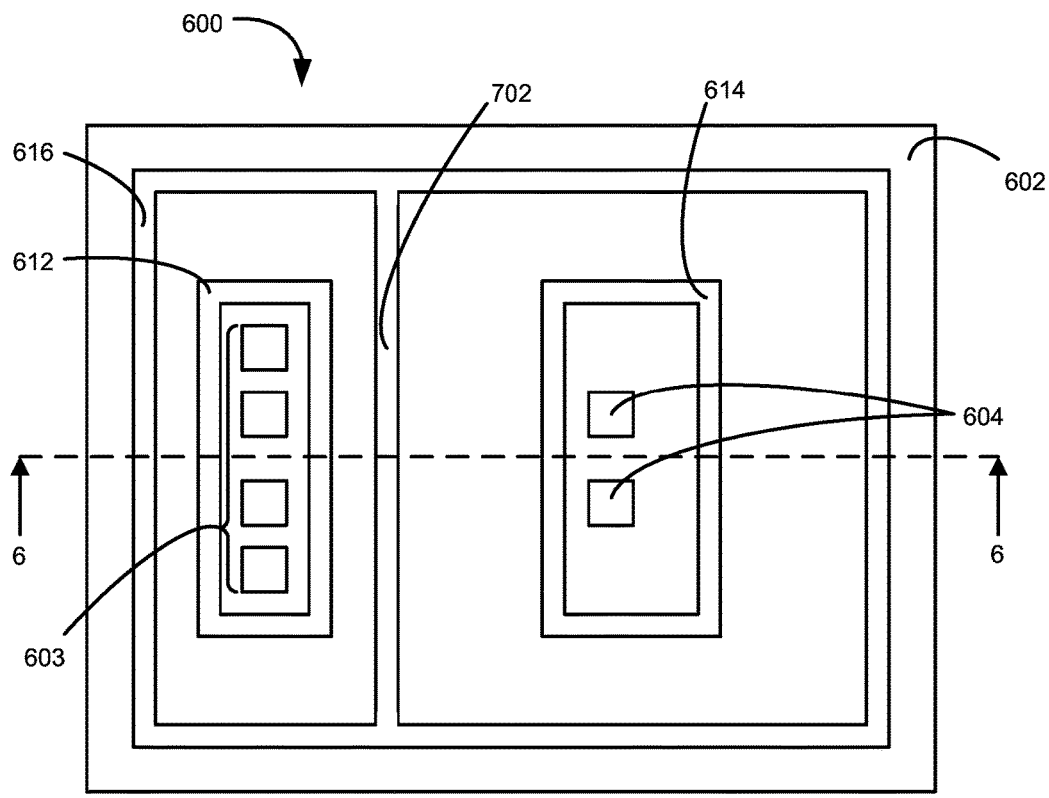
FIG. 7 is a cross-sectional view along a line 7-7 in FIG. 6 of the semiconductor device in accordance with an embodiment of the present technology.

FIG. 6 is a cross-sectional view along a line 6-6 in FIG. 7 of a semiconductor device 600 (e.g., a TSV die assembly, including a 3DI device or a die-stacked package) in accordance with an embodiment of the present technology. The semiconductor device 600 can include multiple stacked dies (e.g., a first die 601, a second die 602, additional dies, a substrate 606, etc.). Similar to the semiconductor device 200 of FIG. 2 and/or the semiconductor device 400 of FIG. 4, the first die 601 and the second die 602 can be mounted on or connected to the substrate 606 (e.g., a PCB or another die). As illustrated in FIG. 6, the first die 601 can be directly attached to and directly over the second die 602, and the second die 602 can be directly attached to and directly over the substrate 606.

Metal or conductive interconnects (e.g., first top interconnects 603, second top interconnects 604, bottom interconnects 605, etc.) can extend vertically to directly contact and electrically couple the dies. As illustrated in FIG. 6, the first top interconnects 603 and/or the second top interconnects 604 can extend vertically between and directly contact the first die 601 and the second die 602. Further, the bottom interconnects 605 can extend vertically between and directly contact the second die 602 and the substrate 606.

Further similar to the semiconductor device 200 and/or the semiconductor device 400, one or more sets of the interconnects can be encircled or peripherally surrounded by one or more metal enclosures (the enclosure 210 of FIG. 2, the first enclosure 412 of FIG. 4, the second enclosure 414 of FIG. 4, etc). For example, the semiconductor device 600 can include a first top enclosure 612, a second top enclosure 614, a third top enclosure 616, a first bottom enclosure 618, a second bottom enclosure 620, or a combination thereof. As illustrated in FIG. 6, the first top enclosure 612 can encircle or surround the first top interconnects 603, and the second top enclosure 614 can encircle the second top interconnects 604 and be separate from the first top enclosure 612 (e.g., for a non-nested configuration of the enclosures). In some embodiments, the third top enclosure 616 can encircle or surround the first top enclosure 612 and/or the second top enclosure 614. Similarly as illustrated in FIGS. 5 and 6, the first bottom enclosure 618 can encircle or surround the bottom interconnects 605 and the second bottom enclosure 620 can encircle or surround the first bottom enclosure 618.

In some embodiments, the dies can electrically connect to each other directly without routing through electrical circuits in an intervening die located between the coupled dies. For example, the interconnects can bypass a middle die (e.g., outside of a peripheral edge of the middle die that doesn't extend to the peripheral edges of the outer dies above and below the middle die) and directly contact the outer dies. Also for example, one or more of the dies can include one or more TSVs 608 (e.g., vertical interconnects that pass completely through the die thereon). Based on the TSVs 608, the outer dies can electrically connect to each other directly (e.g., without electrically routing through circuits in the middle die) while passing the electrical signals or levels through the middle die. The TSVs 608 can directly contact the interconnects (e.g., the first top interconnects 603, the second top interconnects 604, the bottom interconnects 605, etc.), the enclosures (e.g., the first top enclosure 612, the second top enclosure 614, the third top enclosure 616, the first bottom enclosure 618, the second bottom enclosure 620, etc.), or a combination thereof.

FIG. 7 is a cross-sectional view along a line 7-7 in FIG. 6 of the semiconductor device 600 in accordance with an embodiment of the present technology. FIG. 7 can correspond to a top view of the semiconductor device 600 without the first die 601 of FIG. 6.

As discussed above, the one or more metal enclosures can be nested or concentric (e.g., as illustrated in FIG. 5), non-nested, overlapped, or a combination thereof. For example, the enclosures can be non-nested, such as illustrated by the first top enclosure 612 and the second top enclosure 614. The first top enclosure 612 can encircle or surround the first top interconnects 603, and the second top enclosure 614 can encircle the second top interconnects 604 and be separate from the first top enclosure 612 (e.g., for a non-nested configuration of the enclosures). Also for example, the enclosures can be nested (e.g., in a concentric or a non-concentric arrangement), such as illustrated between the first top enclosure 612 and the third top enclosure 616 and/or between the second top enclosure 614 and the third top enclosure 616. The third top enclosure 616 can encircle or surround the first top enclosure 612 and the second top enclosure 614. Also for example, portions of the enclosures can overlap each other, such as illustrated by an enclosure overlap portion 702. The third top enclosure 616 can be configured based on overlapping two separate and coplanar enclosures, with the overlap forming the enclosure overlap portion 702.

Electrically connecting the metal enclosure(s) to the TSVs 608 provides reduced package size. The direct contact between the enclosures that have electrical connections (e.g., to signals, power sources, ground, etc.) and the TSVs 608 can allow for increased connection possibilities by allowing pass of electrical circuits of intervening dies.

Figure 8:
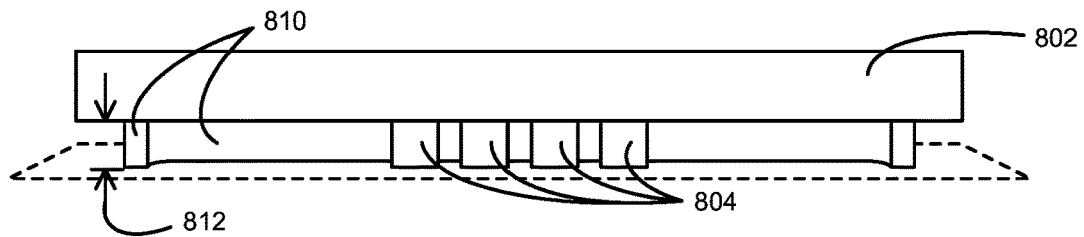
FIGS. 8-11 are cross-sectional views illustrating a semiconductor device at selected stages in a manufacturing method in accordance with an embodiment of the present technology.
Figure 9:
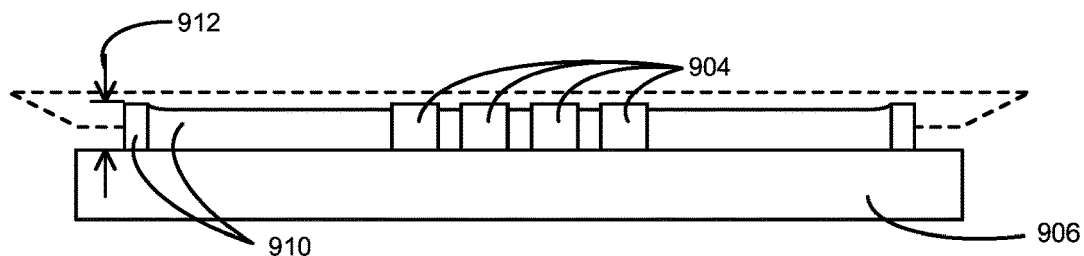

FIGS. 8-9 are cross-sectional views illustrating a semiconductor device at selected stages in a manufacturing method in accordance with an embodiment of the present technology. As illustrated in FIG. 8, the method can include a stage for providing a die 802 (e.g., the die 202 of FIG. 2 or the die 402 of FIG. 4). The die 802 can include die interconnects 804 (e.g., solid metal structures for providing electrical connections to circuits within the die 802, such as for a portion of the interconnects 204 of FIG. 2 or a portion of the interconnects 404 of FIG. 4) protruding below a die bottom surface (e.g., the die bottom surface 222 of FIG. 2). The die 802 can further include a die enclosure 810 (e.g., a solid metal structure, such as for a portion of the metal enclosure structure 210 of FIG. 2, a portion of the first enclosure 412 of FIG. 4 or the second enclosure 414 of FIG. 4, etc.) encircling a perimeter of the die interconnects 804 along a horizontal plane.

The die 802 with the die interconnects 804 and the die enclosure 810 can be manufactured using a separate manufacturing process (e.g., wafer or die level manufacturing process). The separate manufacturing process can produce the die interconnects 804 and the die enclosure 810 according to a protrusion measure 812 (e.g., a height of the metal structures, such as a length measured between the die bottom surface 222 and a distal portion of the die interconnects 804 and the die enclosure 810). In some embodiments, the protrusion measure 812 can include a distance less than 20 µm. According to the protrusion measure 812, the distal portions (e.g., relative to the die bottom surface 222) of the die interconnects 804 and the die enclosure 810 can be coplanar along a horizontal plane that is parallel with the die bottom surface 222.

As illustrated in FIG. 9, the method can include a stage for providing a substrate 906 (e.g., the substrate 206 of FIG. 2 or the substrate 406 of FIG. 4). The substrate 906 can include substrate interconnects 904 (e.g., solid metal structures for providing electrical connections to the substrate 906, such as for a portion of the interconnects 204 of FIG. 2 or a portion of the interconnects 404 of FIG. 4) protruding above a substrate top surface (e.g., the substrate top surface 224 of FIG. 2. The substrate 906 can further include a substrate enclosure 910 (e.g., a solid metal structure, such as for a portion of the metal enclosure structure 210 of FIG. 2, a portion of the first enclosure 412 of FIG. 4 or the second enclosure 414 of FIG. 4, etc.) encircling a perimeter of the substrate interconnects 904 along a horizontal plane.

The substrate 906 with the substrate interconnects 904 and the substrate enclosure 910 (e.g., another die with interconnects and enclosure, such as illustrated in FIG. 8) can be manufactured using a separate manufacturing process (e.g., wafer or die level manufacturing process or a process for manufacturing a printed circuit board). Similar to the stage illustrated in FIG. 8, the separate manufacturing process can produce the substrate interconnects 904 and the substrate enclosure 910 according to a protrusion measure 912 (e.g., a height of the metal structures, such as a length measured between the substrate top surface 224 and a distal portion of the substrate interconnects 904 and the substrate enclosure 910). In some embodiments, the protrusion measure 912 can include a distance less than 20 µm. According to the protrusion measure 912, the distal portions (e.g., relative to the substrate top surface 224) of the substrate interconnects 904 and the substrate enclosure 910 can be coplanar along a horizontal plane that is parallel with the substrate top surface 224.

Figure 10:
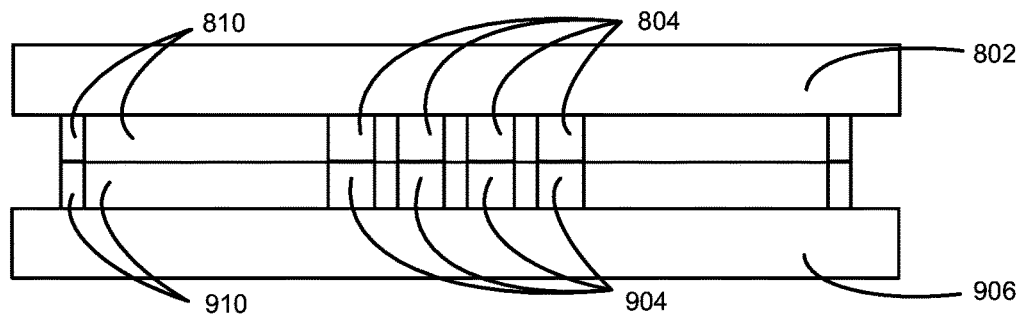

As illustrated in FIG. 10, the method can include a stage for aligning the substrate 906 and the die 802. The substrate 906 and the die 802 can be aligned based on aligning reference portions (e.g., a center portion, a periphery edge or surface, etc.) thereof along a line or a plane (e.g., a vertical line or plane for FIG. 10). The structures can be aligned such that the die enclosure 810 and the substrate enclosure 910 are aligned along a line or a plane (e.g., a vertical line or plane). Further, the structures can be aligned such that the die enclosure 810 and the substrate enclosure 910 directly contact each other. The die interconnects 804 and the substrate interconnects 904 can be similarly aligned.

Figure 11:
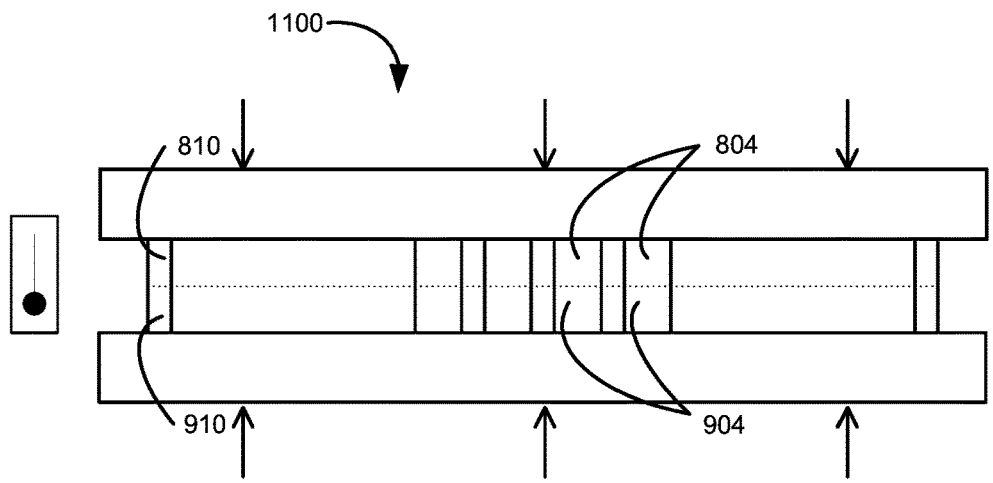

As illustrated in FIG. 11, the method can include a stage for bonding the metal structures (e.g., the die enclosure 810 to the substrate enclosure 910 and/or the die interconnects 804 to the substrate interconnects 904). For example, FIG. 11 can represent a diffusion bonding process 1100 (e.g., Cu—Cu diffusion bonding) that includes a solid-state welding process for joining metals based on solid-state diffusion. The diffusion bonding process 1100 can include creating a vacuum condition or filling the space (e.g., the enclosed space) with inert gas, heating the metal structures, pressing the metal structures together, or a combination thereof.

Based on the bonding stage, the metal structures can bond or fuse and form a continuous structure. For example, the die enclosure 810 and the substrate enclosure 910 can be bonded to form the enclosure 210 of FIG. 2, the first enclosure 412 of FIG. 4, or the second enclosure 414 of FIG. 4. Also for example, the die interconnects 804 and the substrate interconnects 904 can be bonded to form the interconnects 204 of FIG. 2 or the interconnects 404 of FIG. 4.

Diffusion bonding the die enclosure 810 to the substrate enclosure 910 (e.g., Cu—Cu diffusion bonding) and the die interconnects 804 and the substrate interconnects 904 (e.g., Cu—Cu diffusion bonding) provides reduced manufacturing failures and cost. The diffusion bonding process can eliminate solder, thereby reducing any potential failures and costs associated with the soldering process. Further, the interconnects and the enclosures can be bonded using one bonding process, which can further simply the manufacturing process.

Figure 12:
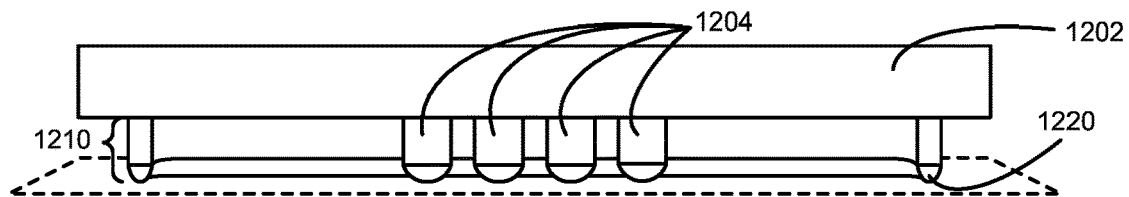
FIGS. 12-15 are cross-sectional views illustrating a semiconductor device at selected stages in a further manufacturing method in accordance with an embodiment of the present technology.

FIGS. 12-15 are cross-sectional views illustrating a semiconductor device at selected stages in a further manufacturing method in accordance with an embodiment of the present technology. As illustrated in FIG. 12, the method can include a stage for providing a die 1202 (e.g., the die 202 of FIG. 2 or the die 402 of FIG. 4). Similar to the stage illustrated in FIG. 8, the die 1202 can include die interconnects 1204 (e.g., solid metal structures for providing electrical connections to circuits within the die 602, such as for a portion of the interconnects 204 of FIG. 2 or a portion of the interconnects 404 of FIG. 4) protruding below a die bottom surface (e.g., the die bottom surface 222 of FIG. 2).

The die 1202 can further include a die enclosure 1210 (e.g., a solid metal structure, such as for a portion of the metal enclosure structure 210 of FIG. 2, a portion of the first enclosure 412 of FIG. 4 or the second enclosure 414 of FIG. 4, etc.) encircling a perimeter of the die interconnects 1204 along a horizontal plane. In some embodiments, the die enclosure 1210 can include solder 1220 attached at a distal portion (e.g., with respect to the die bottom surface 222) of a metal wall extending away from the die bottom surface 222. In some embodiments, the die enclosure 1210 can include the solder 1220 (e.g., Cu or Cu+ solder tip) directly contacting the die bottom surface 222 (e.g., where the die enclosure 1210 is formed out of the solder 1220). In some embodiments, the die enclosure 1210 can be bulk solder (e.g., without any separate metal wall structure).

Figure 13:
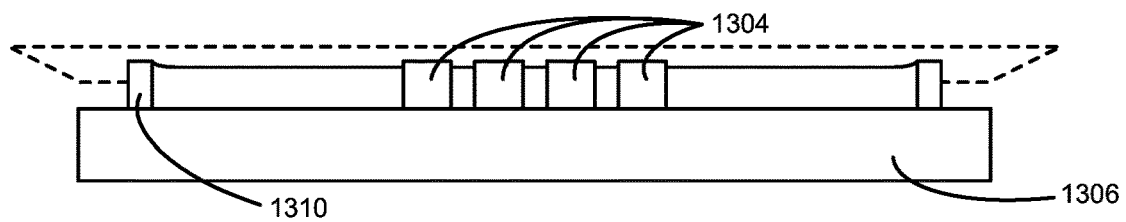

As illustrated in FIG. 13, the method can include a stage for providing a substrate 1306 (e.g., the substrate 206 of FIG. 2 or the substrate 406 of FIG. 4). Similar to the stage illustrated in FIG. 9, the substrate 1306 can include substrate interconnects 1304 (e.g., solid metal structures for providing electrical connections to the substrate 1306, such as for a portion of the interconnects 204 of FIG. 2 or a portion of the interconnects 404 of FIG. 4) protruding above a substrate top surface (e.g., the substrate top surface 224 of FIG. 2). The substrate 1306 can further include a substrate enclosure 1310 (e.g., a solid metal structure, such as for a portion of the metal enclosure structure 210 of FIG. 2, a portion of the first enclosure 412 of FIG. 4 or the second enclosure 414 of FIG. 4, etc.) encircling a perimeter of the substrate interconnects 1304 along a horizontal plane.

In some embodiments, the substrate enclosure 1310 can include the solder 1220 of FIG. 12. For example, the substrate enclosure 1310 can be formed out of the solder 1220 (e.g., with the solder 1220 directly contacting the substrate top surface 224). Also for example, the substrate enclosure 1310 can include solder 1220 attached at a distal portion (e.g., with respect to the substrate top surface 224) of a metal wall extending away from the substrate top surface 224. Also for example, the solder 1220 can be included in the substrate enclosure 1310 instead of the die enclosure 1210, or in both the substrate enclosure 1310 and the die enclosure 1210.

Figure 14:
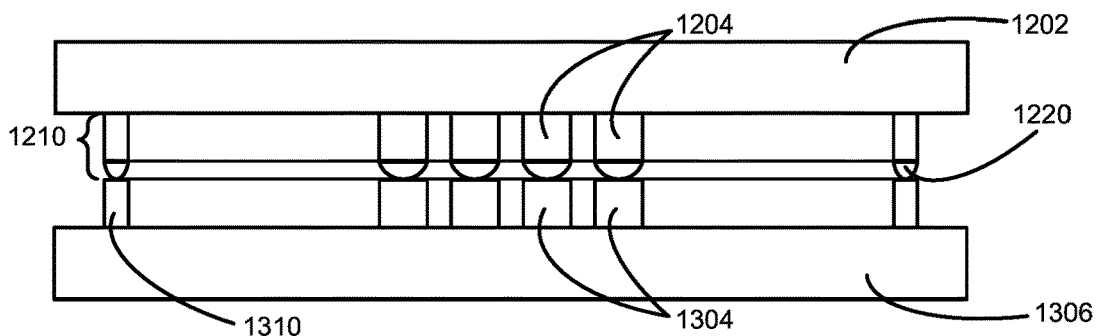

As illustrated in FIG. 14, the method can include a stage for aligning the substrate 1306 and the die 1202. Similar to the stage illustrated in FIG. 10, the substrate 1306 and the die 1202 can be aligned based on aligning reference portions (e.g., a center portion, a periphery edge or surface, etc.) thereof along a line or a plane, with the die enclosure 1210 and the substrate enclosure 1310 aligned along a further line or plane (e.g., along a vertical direction). Further, the structures can be aligned such that the die enclosure 1210 and the substrate enclosure 1310 directly contact each other (e.g., with the solder 1220 making direct contact with the substrate enclosure 1310). The die interconnects 1204 and the substrate interconnects 1304 can be similarly aligned.

Figure 15:
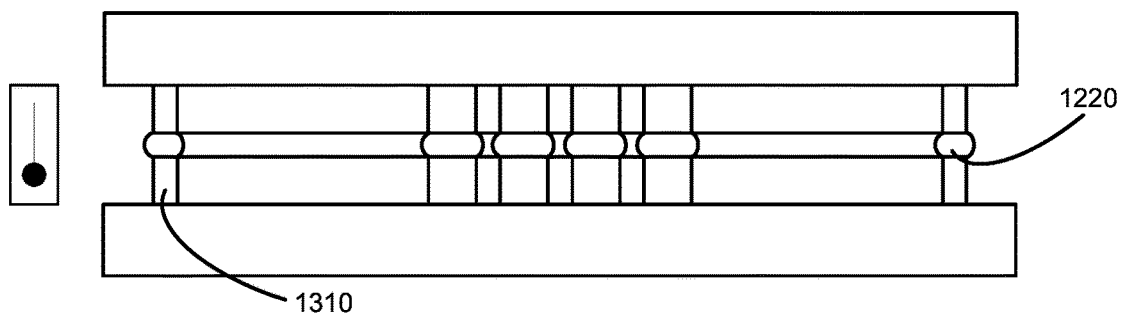

As illustrated in FIG. 15, the method can include a stage for bonding the metal structures (e.g., the die enclosure 1210 of FIG. 14 to the substrate enclosure 1310 of FIG. 14 and/or the die interconnects 1204 of FIG. 14 to the substrate interconnects 1304 of FIG. 14). For example, FIG. 15 can represent a process for reflowing (e.g., mass reflow) the solder 1220, such as based on heating the solder 1220.

Based on reflowing the solder 1220, a continuous wall structure can be formed encircling the interconnects. For example, the die enclosure 1210 and the substrate enclosure 1310 can be bonded to form the enclosure 210 of FIG. 2, the first enclosure 412 of FIG. 4, or the second enclosure 414 of FIG. 4. Similarly, the die interconnects 1204 and the substrate interconnects 1304 can be bonded to form the interconnects 204 of FIG. 2 or the interconnects 404 of FIG. 4.

Figure 16:
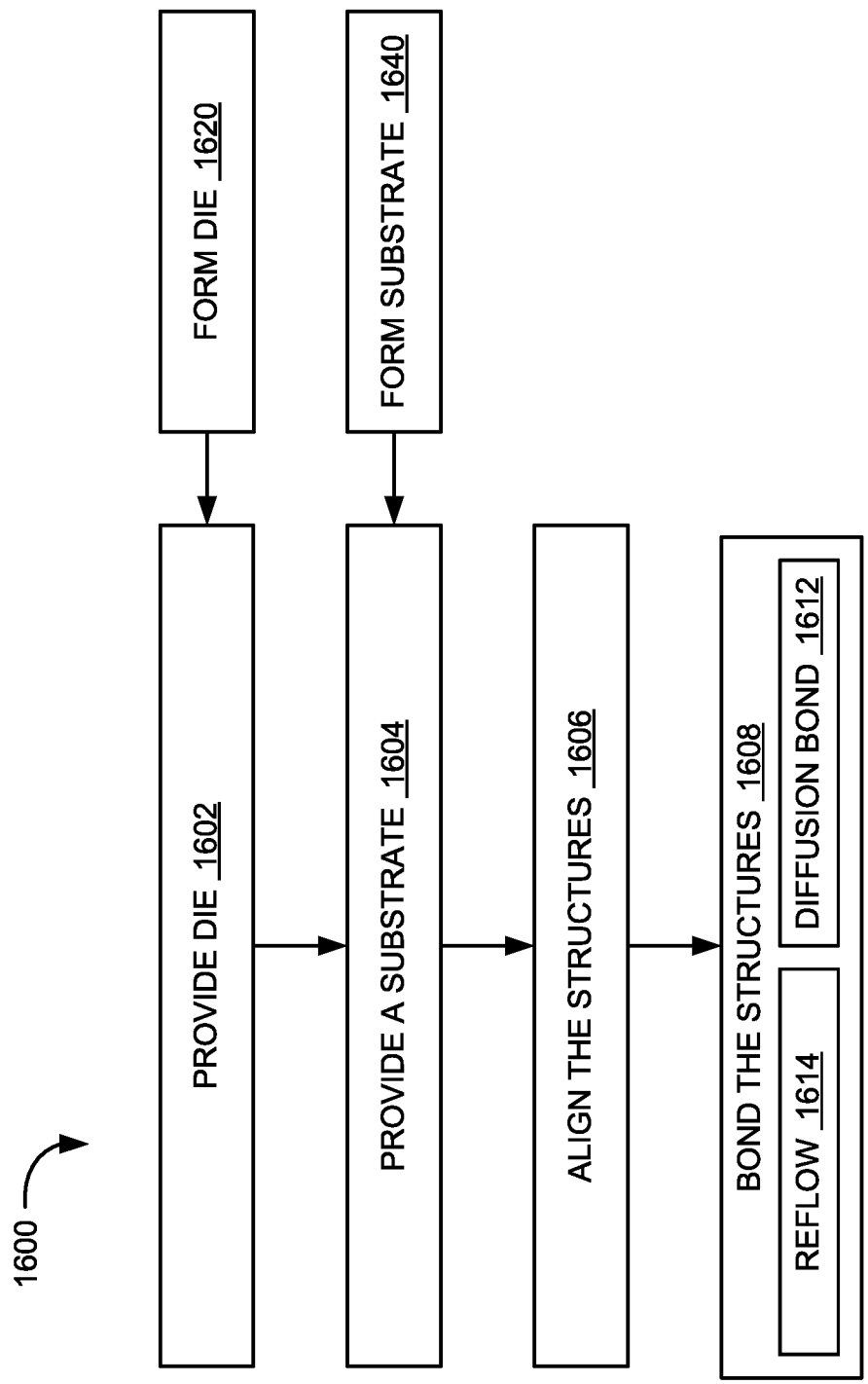
FIG. 16 is a flow diagram illustrating an example method of manufacturing a semiconductor device in accordance with an embodiment of the present technology.

FIG. 16 is a flow diagram illustrating an example method 1600 ("method 1600") of manufacturing a semiconductor device in accordance with an embodiment of the present technology. For example, the method 1600 can be implemented to manufacture the semiconductor device 200 of FIG. 2 and/or the semiconductor device 400 of FIG. 4. Also for example, the method 1600 can include stages illustrated in FIGS. 8-15.

The method 1600 can include providing a semiconductor die (e.g., the die 802 of FIG. 8 or the die 1202 of FIG. 12) as illustrated at block 1602. Providing the semiconductor die can correspond to the stage illustrated in FIG. 8 and/or FIG. 12. The provided die can include die interconnects (e.g., the die interconnects 804 of FIG. 8 or the die interconnects 1204 of FIG. 12) and a die enclosure (e.g., the die enclosure 810 of FIG. 10 or the die enclosure 1210 of FIG. 12) protruding downward from the die bottom surface 222 of FIG. 2. The die enclosure can peripherally surround the die interconnects on or along the die bottom surface 222. The provided die can further have bottom or distal portions or surfaces of the die interconnects coplanar with bottom or distal portions or surfaces of the die enclosure. For example, the bottom or distal portions of the die interconnects and the die enclosure can be coplanar along a horizontal plane that is parallel to the die bottom surface 222 and is vertically offset from the die bottom surface 222 by the protrusion measure 812 of FIG. 8.

In some embodiments the die enclosure can include copper, aluminum, nickel, other metals, or a combination thereof. In some embodiments the die enclosure can include solder directly contacting the die bottom surface 222 or directly attached to a distal surface or portion of a metal wall structure. In some embodiments, the die enclosure can be electrically connected (e.g., the first electrical connection 512 of FIG. 5 or the second electrical connection 514 of FIG. 5) to a signal or a voltage level (e.g., such as a voltage source or ground).

The die can be manufactured or formed using a separate manufacturing process, as illustrated at block 1620. For example, the die manufacturing process can include wafer-level processing, such as a doping process to form integrated circuitry and a singulating process to separate the individual dies.

The method 1600 can further include providing a substrate (e.g., the substrate 906 of FIG. 9 or the substrate 1306 of FIG. 13) as illustrated at block 1604. Providing the substrate can correspond to the stage illustrated in FIG. 9 and/or FIG. 13. The provided substrate can include substrate interconnects (e.g., the substrate interconnects 904 of FIG. 9 or the substrate interconnects 1304 of FIG. 13) and a substrate enclosure (e.g., the substrate enclosure 910 of FIG. 9 or the substrate enclosure 1310 of FIG. 13) protruding upward from the substrate top surface 224 of FIG. 2. The substrate enclosure can peripherally surround the substrate interconnects on or along the substrate top surface 224. The provided substrate can further have top or distal portions or surfaces of the substrate interconnects coplanar with top or distal portions or surfaces of the substrate enclosure. For example, the top or distal portions of the substrate interconnects and the substrate enclosure can be coplanar along a horizontal plane that is parallel to the substrate top surface 224 and is vertically offset from the substrate top surface 224 by the protrusion measure 912 of FIG. 9.

In some embodiments the substrate enclosure can include copper, aluminum, nickel, other metals, or a combination thereof. In some embodiments the substrate enclosure can include solder directly contacting the substrate top surface 224 or directly attached to a distal surface or portion of a metal wall structure. In some embodiments, the substrate enclosure can be electrically connected (e.g., the first electrical connection 512 or the second electrical connection 514) to a signal or a voltage level (e.g., such as a voltage source or ground).

The substrate can be manufactured or formed using a separate manufacturing process, as illustrated at block 1640. For example, the substrate manufacturing process (e.g., for manufacturing another die) can include wafer-level processing similar to processes illustrated by block 1620. Also for example, the substrate manufacturing process (e.g., for manufacturing PCB substrate) can include solder mask shaping, trace formation, planarization, etc.

The method 1600 can further include aligning the structures (e.g., the die and the substrate) as illustrated at block 1606. Aligning the structures can correspond to the stage illustrated in FIG. 10 and/or FIG. 14. For example, the alignment process can align the die over the substrate with a portion of each die interconnect coincident with a corresponding portion of each substrate interconnect along vertical lines and/or a portion of the die enclosure coincident with the substrate enclosure along vertical lines. Also for example, the alignment process can align the die over the substrate with the die enclosure directly contacting the substrate enclosure.

The method 1600 can further include bonding the structures (e.g., the die interconnects to the substrate interconnects and/or the die enclosure to the substrate enclosure) as illustrated at block 1608. The bonding process can correspond to the stage illustrated in FIG. 11 and/or FIG. 15. The bonding process can include controlling temperature of one or more of the structures (e.g., heating to bond and then cooling to solidify the jointed structures), applying pressure on the structures, or a combination thereof. For example, the bonding process can include diffusion bonding (e.g., thermal compression bonding or TCB) as illustrated at block 1612 and/or reflowing solder (e.g., mass reflow in the case solder is applied) as illustrated at block 1614.

Through the bonding process, the enclosure 210 (e.g., including multiple enclosures, such as the first enclosure 412 and the second enclosure 414), the enclosed space 226 can form for the interconnects 204. Since metal (e.g., copper, solder, etc.) sufficiently blocks moisture and other debris, underfill (e.g., the underfill 110 of FIG. 1) is no longer needed for the manufacturing process. As such, the bonding process can bond the structures without any underfill in the enclosed space 226 or in the space between the substrate top surface 224 and the die bottom surface 222. Further, the above described bonding process can eliminate oxide to oxide bonding (e.g., for hybrid bonding) and/or the requirement on wafer surface conditions (e.g., surface roughness control), which can lead to lower manufacturing cost and error.

Figure 17:
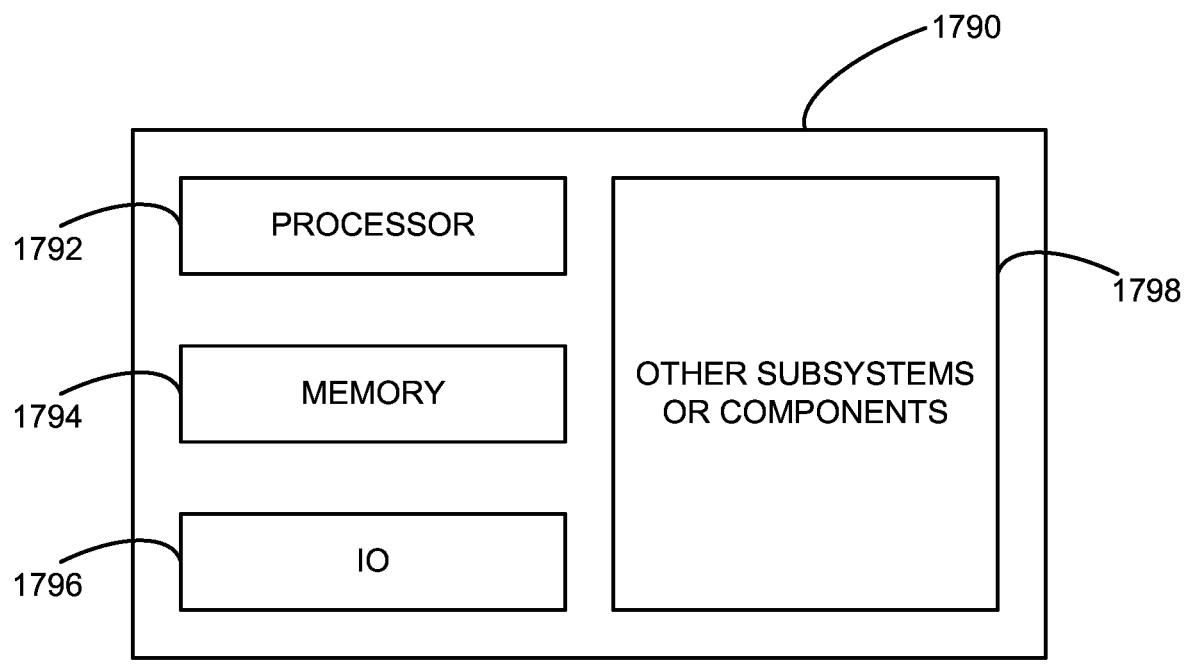
FIG. 17 is a block diagram illustrating a system that incorporates a semiconductor device in accordance with embodiments of the present technology.

FIG. 17 is a block diagram illustrating a system that incorporates a semiconductor device in accordance with embodiments of the present technology. Any one of the semiconductor devices having the features described above with reference to FIGS. 1-16 can be incorporated into any of a myriad of larger and/or more complex systems, a representative example of which is system 1790 shown schematically in FIG. 17. The system 1790 can include a processor 1792, a memory 1794 (e.g., SRAM, DRAM, flash, and/or other memory devices), input/output devices 1796, and/or other subsystems or components 1798. The semiconductor assemblies, devices, and device packages described above with reference to FIGS. 1-14 can be included in any of the elements shown in FIG. 17. The resulting system 1790 can be configured to perform any of a wide variety of suitable computing, processing, storage, sensing, imaging, and/or other functions. Accordingly, representative examples of the system 1790 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1790 include lights, cameras, vehicles, etc. With regard to these and other examples, the system 1790 can be housed in a single unit or distributed over multiple interconnected units, e.g., through a communication network. The components of the system 1790 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A method of manufacturing a semiconductor device, comprising:
   providing a die including die interconnects and a die enclosure, wherein:
      the die interconnects protrude from a die bottom surface, and
      the die enclosure protrudes from the die bottom surface and continuously encircles the die interconnects;
   providing a substrate including substrate interconnects and a substrate enclosure,
      wherein:
      the substrate interconnects protrude from a substrate top surface, and
      the substrate enclosure protrudes from the substrate top surface and continuously encircles the substrate interconnects; and
   bonding the substrate interconnects to the die interconnects and the substrate enclosure to the die enclosure.

2. The method of claim 1, wherein:
   providing the die includes providing the die with bottom portions of the die interconnects coplanar with a bottom portion of the die enclosure; and
   providing the substrate includes providing the substrate with top portions of the substrate interconnects coplanar with a top portion of the substrate enclosure.

3. The method of claim 1, wherein:
   providing the die includes providing the die with the bottom portions of the die and the bottom portion of the die enclosure that are coplanar with a horizontal plane that is parallel with the die bottom surface; and
   providing the substrate includes providing the substrate with the top portions of the substrate interconnects and the top portion of the substrate enclosure that are coplanar with a horizontal plane that is parallel with the substrate top surface.

4. The method of claim 1, wherein:
   providing the die includes providing the die with the die enclosure that includes copper;
   providing the substrate includes providing the substrate with the substrate enclosure that includes copper; and
   bonding includes diffusion bonding the die enclosure and the substrate enclosure.

5. The method of claim 4, wherein the die enclosure and the substrate enclosure both include the same metallic material.

6. The method of claim 5, wherein the die enclosure and the substrate enclosure both include copper.

7. The method of claim 4, wherein diffusion bonding includes forming a seam where the die enclosure fuses with the substrate enclosure.

8. The method of claim 1, wherein bonding includes bonding the substrate enclosure to the die enclosure without underfill between a space surrounded by the substrate enclosure and the die enclosure.

9. The method of claim 1, wherein providing the die includes providing the die with the die enclosure electrically coupled to ground or a voltage source.

10. The method of claim 1, wherein:
    the die enclosure directly contacts the die bottom surface; and
    the substrate enclosure directly contacts the substrate top surface.

11. The method of claim 10, wherein:
    the die enclosure does not include solder; and
    the substrate enclosure does not include solder.

12. The method of claim 1, wherein:
    providing the die includes forming the die enclosure on the die bottom surface; and
    providing a substrate includes forming the substrate enclosure on the substrate top surface.

13. The method of claim 1, wherein:
    the die enclosure is a first die enclosure and the substrate enclosure is a first substrate enclosure;
    the die includes a second die enclosure protruding from the die bottom surface:
    the substrate includes a second substrate enclosure protruding from the substrate top surface; and
    bonding includes bonding the second die enclosure to the second substrate enclosure.

14. The method of claim 13, wherein:
    the second die enclosure continuously encircles the die interconnects and/or the first die enclosure; and
    the second substrate enclosure continuously encircles the substrate interconnects and/or the first substrate enclosure.

15. The method of claim 13, wherein:
    the first die enclosure and/or the first substrate enclosure are/is electrically coupled to a first voltage potential; and
    the second die enclosure and/or the second substrate enclosure are/is electrically coupled to a second voltage potential different than the first voltage potential.

* * * * *